US010660203B2

(12) United States Patent
Zhang

(10) Patent No.: US 10,660,203 B2
(45) Date of Patent: May 19, 2020

(54) DISPLAY AND CIRCUIT BOARD STRUCTURE THEREOF

(71) Applicant: HUIZHOU CHINA STAR OPTOELECTRONICS TECHNOLOGY CO., LTD., Huizhou Guangdong (CN)

(72) Inventor: Yanxue Zhang, Huizhou Guangdong (CN)

(73) Assignee: HUIZHOU CHINA STAR OPTOELECTRONICS TECHNOLOGY CO., LTD., Huizhou (CN)

(*) Notice: Subject to any disclaimer, the term of this patent is extended or adjusted under 35 U.S.C. 154(b) by 213 days.

(21) Appl. No.: 15/754,500

(22) PCT Filed: Jan. 17, 2018

(86) PCT No.: PCT/CN2018/073062
§ 371 (c)(1),
(2) Date: Feb. 22, 2018

(87) PCT Pub. No.: WO2019/127713
PCT Pub. Date: Jul. 4, 2019

(65) Prior Publication Data
US 2019/0387624 A1 Dec. 19, 2019

(30) Foreign Application Priority Data
Dec. 29, 2017 (CN) .......................... 2017 1 1487399

(51) Int. Cl.
H05K 7/00 (2006.01)
H05K 1/11 (2006.01)
(Continued)

(52) U.S. Cl.
CPC ......... *H05K 1/117* (2013.01); *H01R 13/4226* (2013.01); *H01R 13/6278* (2013.01)

(58) Field of Classification Search
CPC .. G02B 6/3855; G02B 6/3887; G02B 6/3893; G02B 6/4292; G02B 6/42; H01R 12/714;
(Continued)

(56) References Cited

U.S. PATENT DOCUMENTS 5,337,388 A * 8/1994 Jacobowitz .......... G02B 6/3807
385/76
7,660,128 B2 * 2/2010 Crews .................... H05K 1/182
361/733
(Continued)

FOREIGN PATENT DOCUMENTS

CN 2645404 * 9/2004
CN 2645404 Y 9/2004
(Continued)

*Primary Examiner* — Yuriy Semenenko
(74) *Attorney, Agent, or Firm* — Hemisphere Law, PLLC; Zhigang Ma

(57) ABSTRACT

A display and a circuit board structure thereof are provided. The circuit board structure includes a first circuit board, a second circuit board and a connection structure. The connection structure is disposed on the first circuit board, the second circuit board has gold fingers, the connection structure has pins corresponding to the gold fingers, and the connection structure conducts the first circuit board and the second circuit board by connecting the pins with the gold fingers. Therefore, an extra FFC and a connector disposed on the second circuit board for connecting the first circuit board and the second circuit board are saved to achieve cost reduction and assembling process simplification.

12 Claims, 3 Drawing Sheets

(51) Int. Cl.
*H01R 13/422* (2006.01)
*H01R 13/627* (2006.01)

(58) Field of Classification Search
CPC .............. H01R 12/722; H01R 13/6658; H01R 23/7073; H05K 1/182; H05K 2201/10121; H05K 2201/10446
See application file for complete search history.

(56) References Cited

U.S. PATENT DOCUMENTS

| | | | |
|---|---|---|---|
| 8,803,004 B2* | 8/2014 | Guard | H03K 17/962 |
| | | | 174/259 |
| 2003/0063451 A1* | 4/2003 | Fujii | H01R 13/112 |
| | | | 361/785 |
| 2006/0067064 A1* | 3/2006 | Crews | H05K 1/182 |
| | | | 361/761 |
| 2010/0202119 A1* | 8/2010 | Nagami | H05K 1/0281 |
| | | | 361/749 |
| 2013/0100627 A1* | 4/2013 | Cong | G06F 1/185 |
| | | | 361/785 |

FOREIGN PATENT DOCUMENTS

| | | |
|---|---|---|
| CN | 201490371 U | 5/2010 |
| CN | 202385387 | 8/2012 |
| CN | 203434372 U | 2/2014 |

\* cited by examiner

DISPLAY AND CIRCUIT BOARD STRUCTURE THEREOF

RELATED APPLICATIONS

The present application is a National Phase of International Application Number PCT/CN2018/073062, filed Jan. 17, 2018, and claims the priority of China Application No. 201711487399.0, filed Dec. 29, 2017.

FIELD OF THE DISCLOSURE

The present invention relates to a circuit board structure technology field, and more particularly, to a display and a circuit board structure thereof.

BACKGROUND

In the existing large scale product design, the CB circuit board and the XB circuit board need to be designed separately, and these two circuit boards are conducted through a flexible flat cable (FFC). In this design, connectors are needed for both two ends of the XB circuit board and the CB circuit board which are conducted with an FFC therebetween. Because an FFC and an extra number of connectors are used for this design, the overall assembling process becomes more complex, finally resulting in cost increase and yield degradation.

SUMMARY

In order to solve the deficiencies of the prior art, the present invention provides a display and a circuit board structure thereof, which can reduce the cost and simplify the assembling process.

According to a specific technical solution proposed in the present invention, a circuit board structure is provided, which includes a first circuit board, a second circuit board and a connection structure. The connection structure is disposed on the first circuit board, the second circuit board has gold fingers, the connection structure has pins corresponding to the gold fingers, the connection structure conducts the first circuit board and the second circuit board by connecting the pins with the gold fingers.

In one embodiment, the second circuit board has an inserting section disposed at an end thereof, the connection structure has a first slot, the inserting section is located in the first slot, the gold fingers are disposed on the inserting section, and the pins are located in the first slot.

In one embodiment, the inserting section protrudes from an end of the second circuit board.

In one embodiment, the connection structure is disposed at an end of the first circuit board, the second circuit board has a second slot, and the connection structure is located in the second slot.

In one embodiment, the inserting section has a reinforcing plate, and the reinforcing plate and the gold fingers are respectively located on two opposite surfaces of the inserting section.

In one embodiment, the inserting section has engaging grooves respectively at two opposite ends thereof, and the connection structure has snaps respectively corresponding to and wedged in the engaging grooves.

In one embodiment, the connection structure includes a first fastening portion and a second fastening portion that are rotatably connected, the first fastening portion has a first recess, and the second fastening portion has a second recess; when the first fastening portion is mated with the second fastening portion, the first recess and the second recess form the first slot, and the inserting section is sandwiched between the first fastening portion and the second fastening portion.

In one embodiment, the first circuit board and the second circuit board are located in the same plane.

The present invention further provides a display which includes any one of the aforementioned circuit board structures.

The circuit board structure according to the embodiments of the present invention includes a first circuit board, a second circuit board and a connection structure, in which the second circuit board has gold fingers, the connection structure has pins corresponding to the gold fingers, and the connection structure conducts the first circuit board and the second circuit board by connecting the pins with the gold fingers. Therefore, an extra FFC and a connector disposed on the second circuit board for connecting the first circuit board and the second circuit board are saved to achieve cost reduction assembling process simplification.

DETAILED DESCRIPTION OF PREFERRED EMBODIMENTS

Figure 1:
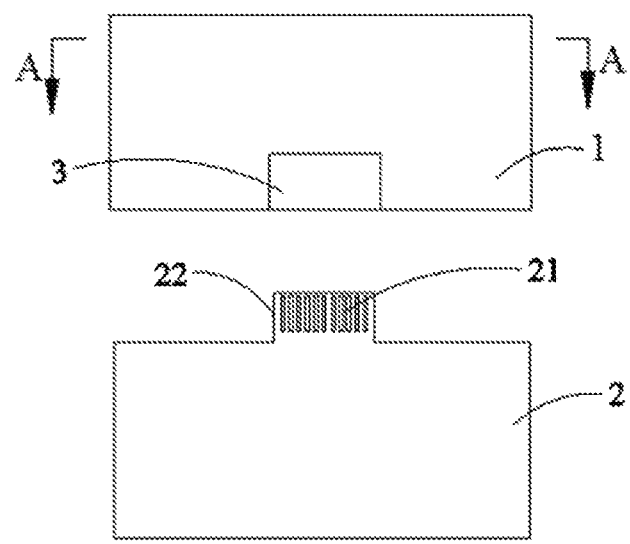
FIG. 1 is a schematic structure diagram of a circuit board structure.
Figure 2:
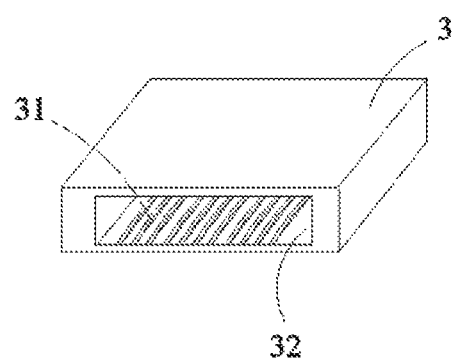
FIG. 2 is a schematic structure diagram of a connection structure.
Figure 3:
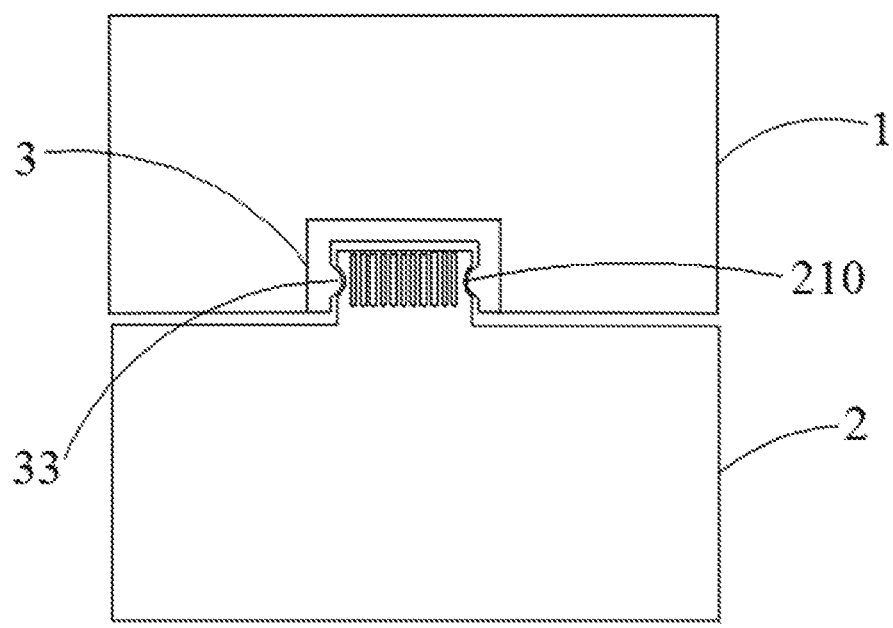
FIG. 3 is a cross sectional diagram of the circuit board structure in FIG. 1 along an A-A direction.

Embodiments of the present disclosure will be described in detail below by referring to the accompany drawings. However, the present disclosure can be embodied in many different forms, and should not be construed as being limited to the specific embodiments set forth herein. Rather, these embodiments are provided for explaining the principle and actual application of the present disclosure, thus other skilled in the art can understand various embodiments and various amendments which are suitable for specific intended applications of the present disclosure. In the drawings, the same reference numerals are used to indicate the same elements.

Referring to FIGS. 1-4, a display according to an embodiment includes a circuit board structure which includes a first circuit board 1, a second circuit board 2 and a connection structure 3. The connection structure 3 is disposed on the first circuit board 1, the second circuit board 2 has gold fingers 21, the connection structure 3 has pins 31 corresponding to the gold fingers, and the connection structure 3 conducts the first circuit board 1 and the second circuit board 2 by connecting the pins 31 with the gold fingers 21. According to the embodiment, the second circuit board 2 is a control circuit board (CB circuit board) of the display, which the first circuit board 1 is another circuit board (XB circuit board) of the display.

The second circuit board 2 has an inserting section 22 disposed at an end thereof, the connection structure 3 has a first slot 32, the inserting section 22 is located in the first slot 32, the gold fingers 21 are disposed on the inserting section 22, and the pins 31 are located in the first slot 32. After the inserting section 22 is inserted into the first slot 32, the gold fingers 21 are exactly connected with the pins 31, thereby connecting the first circuit board 1 and the second circuit board 2. The connection structure 3 is electrically connected to the first circuit board 1.

The inserting section 22 has a reinforcing plate 23, and the reinforcing plate 23 and the gold fingers 21 are located respectively at two opposite surfaces of the inserting section 22, in order to enhance the strength of the inserting section 22. When the inserting section 22 is inserted into the first slot 3, the gold fingers 21 are located between the reinforcing plate 23 and the first circuit board 1, i.e., the reinforcing plate 23 is located above the gold fingers 21 and the pins 31.

In a first embodiment of the present invention, the inserting section 22 protrudes from an end of the second circuit board 2, the inserting section 22 has engaging grooves 210 respectively at two opposite ends thereof, and the connection structure 3 has snaps 33 respectively corresponding to and wedged in the engaging grooves 210. The snaps 33 are flexible snaps, and when the inserting section 22 is being inserted into the first slot 32, the snaps 33 are pressed to have elastic deformation; after the inserting section 22 is completely inserted into the first slot 32, the engaging grooves 210 exactly move to the locations at which the snaps 33 are located, and the snaps 33 recover to the undeformed status because of by the elastic deformation force thereof. Meanwhile, the snaps 33 are exactly wedged in the engaging grooves 210 to fix the inserting section 22 in the first slot 32, so as to prevent the first circuit board 1 from being disconnected from the second circuit board 2.

According to the embodiment of the present invention, the first circuit board 1 are connected to the second circuit board 2 by disposing the gold fingers 21 and the connection structure 3, and therefore an extra FFC and a connector disposed on the second circuit board are saved to achieve cost reduction and assembling process simplification. In addition, the inserting section 22 and the connection structure 3 are fixed by the combination of the snaps 33 and the engaging grooves 210, thereby improving the stability and reliability of the overall circuit board structure.

Figure 4:
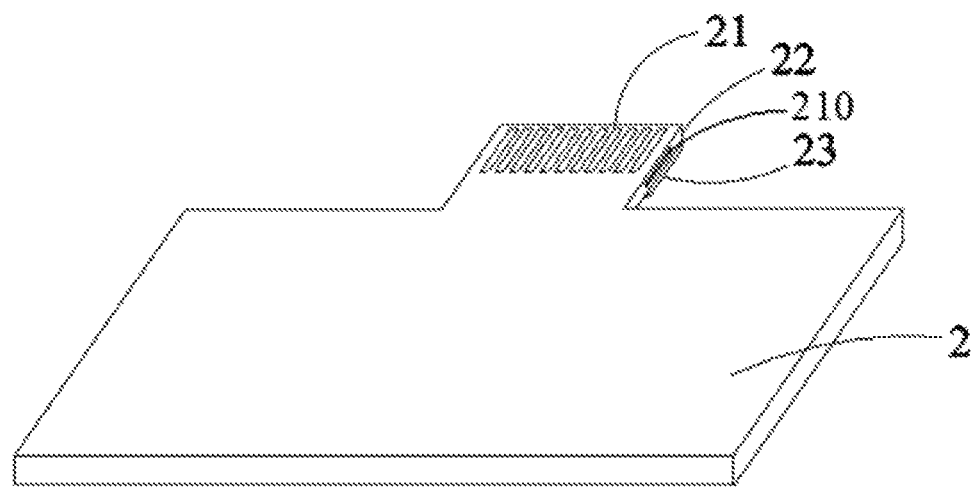
FIG. 4 is a schematic structure diagram of a second circuit board.
Figure 5:
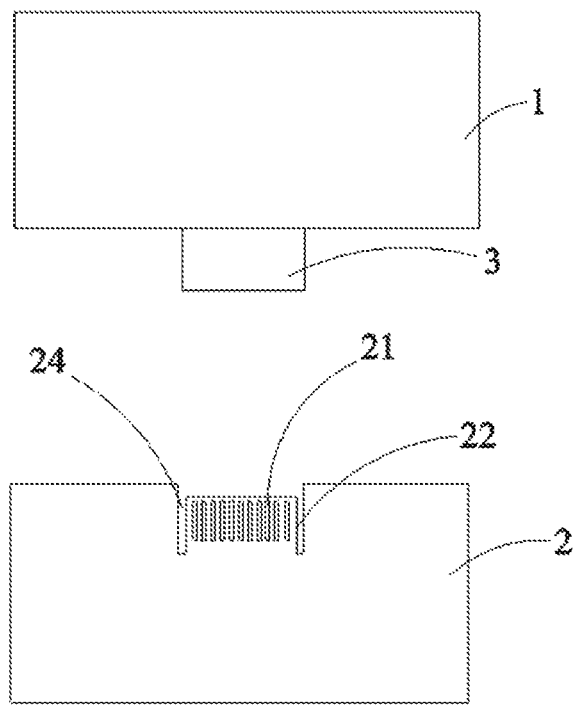
FIG. 5 is a schematic structure diagram of another circuit board structure.
Figure 6:
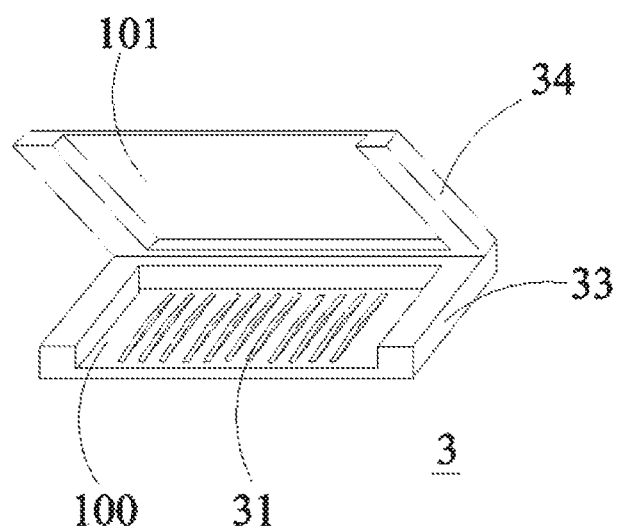
FIG. 6 is a schematic structure diagram of another connection structure.

Referring to FIG. 4 and FIG. 5, in a second embodiment of the present invention, the connection structure 3 is disposed at an end of the first circuit board 1, the second circuit board 2 has a second slot 24, and the connection structure 3 is located in the second slot 24. The inserting section 22 is located in the second slot 24, and when the connection structure 3 is inserted into the second slot 24, the inserting section 22 is exactly located in the first slot 32.

In the embodiment, the connection structure 3 includes a first fastening section 33 and a second fastening section 34 that are rotatably connected, the first fastening section 33 has a first recess 100, and the second fastening section 34 has a second recess 101; when the first fastening section 33 is mated with the second fastening section 34, the first recess 100 and the second recess 101 form the first slot 32, and the inserting section 22 is sandwiched between the first fastening section 33 and the second fastening section 34.

The first fastening section 33 is fixed on the first circuit board 1, the first fastening section 33 is connected with the second fastening section 34 via a rotating shaft, and the pins 31 are disposed in the first recess 100. In the assembling process, the second fastening section 34 is opened to insert the inserting section 22 into the first recess 100 and connect the gold fingers 21 with the pins 31, and then the second fastening section 34 is mated with the first fastening section 33. At this time, the second fastening section 34 is exactly pressed on a surface of the reinforcing plate 23, and therefore the gold fingers 21 and the pins 31 can be contacted well without a bad contact problem.

In the embodiment, in order to reduce the thickness of the overall display, the first circuit board 1 is connected with the second circuit board 2 via the connection structure 3, and then the first circuit board 1 and the second circuit board 2 are located in the same plane, and thus increasing thickness of the overall display resulted from stacking two circuit boards can be prevented.

The above description is merely the specific embodiment of the present invention, and it is noted that, for those ordinary technical personnel in the art, it also can be improved and modified under the circumstance of without disobeying the present application principle, and these improvements and modifications are also considered in the scope of the present application. cm What is claimed is:

What is claimed is:

1. A circuit board structure comprising a first circuit board, a second circuit board and a connection structure, the connection structure is disposed on the first circuit board, the second circuit board has gold fingers, the connection structure has pins corresponding to the gold fingers, the connection structure conducts the first circuit board and the second circuit board by connecting the pins with the gold fingers;
   wherein the second circuit board has an inserting section disposed at an end thereof, the connection structure has a first slot, the inserting section is located in the first slot, the gold fingers are disposed on the inserting section, and the pins are located in the first slot;
   wherein the connection structure comprises a first fastening portion and a second fastening portion that are rotatably connected, the first fastening portion has a first recess, the second fastening portion has a second recess; when the first fastening portion is mated with the second fastening portion, the first recess and the second recess form the first slot, and the inserting section is sandwiched between the first fastening portion and the second fastening portion.

2. The circuit board structure according to claim 1, wherein the inserting section protrudes from an end of the second circuit board.

3. The circuit board structure according to claim 1, wherein the connection structure is disposed at an end of the first circuit board, the second circuit board has a second slot, and the connection structure is located in the second slot.

4. The circuit board structure according to claim 1, wherein the inserting section has a reinforcing plate, and the reinforcing plate and the gold fingers are respectively located on two opposite surfaces of the inserting section.

5. The circuit board structure according to claim 1, wherein the inserting section has engaging grooves respectively at two opposite ends thereof, and the connection structure has snaps respectively corresponding to and wedged in the engaging grooves.

6. The circuit board structure according to claim 1, wherein the first circuit board and the second circuit board are located in the same plane.

7. A display comprising a circuit board structure, the circuit board structure comprises a first circuit board, a second circuit board and a connection structure, the connection structure is disposed on the first circuit board, the second circuit board has gold fingers, and the connection structure has pins corresponding to the gold fingers, and the connection structure conducts the first circuit board and the second circuit board by connecting the pins with the gold fingers;

wherein the second circuit board has an inserting section disposed at an end thereof, the connection structure has a first slot, the inserting section is located in the first slot, the gold fingers are disposed on the inserting section, and the pins are located in the first slot;

wherein the connection structure comprises a first fastening portion and a second fastening portion that are rotatably connected, the first fastening portion has a first recess, and the second fastening portion has a second recess; when the first fastening portion is mated with the second fastening portion, the first recess and the second recess form the first slot, the inserting section is sandwiched between the first fastening portion and the second fastening portion.

8. The display according to claim 7, wherein the inserting section protrudes from an end of the second circuit board.

9. The display according to claim 7, wherein the connection structure is disposed at an end of the first circuit board, the second circuit board has a second slot, and the connection structure is located in the second slot.

10. The display according to claim 7, wherein the inserting section has a reinforcing plate, and the reinforcing plate and the gold fingers are located on two opposite surfaces of the inserting section.

11. The display according to claim 7, wherein the inserting section has engaging grooves respectively at two opposite ends thereof, and the connection structure has snaps respectively corresponding to and wedged in the engaging grooves.

12. The display according to claim 7, wherein the first circuit board and the second circuit board are located in the same plane.

\* \* \* \* \*